310-334 SR

OR 3,973,150

X 89466

United States Patent [19]

Tamura et al.

[11] 3,973,150

[45] Aug. 3, 1976

[54] RECTANGULAR, ORIENTED POLYMER, PIEZOELECTRIC DIAPHRAGM

[75] Inventors: Masahiko Tamura; Kiyonori Iwama; Toshikazu Yoshimi, all of Tokorozawa, Japan

[73] Assignee: Pioneer Electronic Corporation, Tokyo, Japan

[22] Filed: Feb. 12, 1975

[21] Appl. No.: 549,340

[30] Foreign Application Priority Data

Feb. 18, 1974 Japan .......................... 49-19527[U]

[52] U.S. Cl. .................................. 310/9.5; 310/8.2; 310/8.5; 310/9.1; 310/9.6; 179/110 A

[51] Int. Cl.[2] .......................................... H01L 41/04

[58] Field of Search .................. 310/8, 8.2, 8.3, 8.5, 310/8.6, 9.1, 9.4, 9.5, 9.6; 179/110 A, 110 E, 111 R, 180, 111 E

[56] References Cited

UNITED STATES PATENTS

| | | | |
|---|---|---|---|
| 3,792,204 | 2/1974 | Murayama | 310/8.3 X |
| 3,832,580 | 8/1974 | Yamamuro et al. | 310/8.3 X |
| 3,894,198 | 7/1975 | Murayama et al. | 310/8.5 X |

*Primary Examiner*—Mark O. Budd
*Attorney, Agent, or Firm*—Woodhams, Blanchard and Flynn

[57] ABSTRACT

A piezoelectric electro-acoustic transducer employing as a diaphragm a uniaxially stretched film of a shape having the major axis and the minor axis, wherein the expansion-contraction direction of the diaphragm, in which a piezoelectric constant is at a maximum, is substantially in parallel with the minor axis thereof, whereby the piezoelectric electro-acoustic transducer can provide a high converting efficiency, especially in the low frequency range.

8 Claims, 4 Drawing Figures

RECTANGULAR, ORIENTED POLYMER, PIEZOELECTRIC DIAPHRAGM

The present invention relates to a piezoelectric electro-acoustic transducer, and more particularly to a piezoelectric electro-acoustic transducer employing as a diaphragm a uniaxially stretched piezoelectric film which has a great anisotropy and is of a shape having the major axis and the minor axis.

It has been proposed to provide a piezoelectric electro acoustic transducer employing as a diaphragm a resin film which has piezoelectricity. (For example, see U.S. Pat. No. 3,832,580.) Such a piezoelectric film to be used as a diaphragm for electro-acoustic transducer may be prepared from a high molecular weight polymer (See: "Polypeptides Piezoelectric Transducers", by E. Fukuda et al., 6th International Congress on Acoustics, D-31, Tokyo, 1968 and "The Piezoelectricity of Poly(-vinylidene Fluoride)," by H. Kawai, Japan, J. Appl. Phys. 8, 975, 1969). In conventional piezoelectric electro-acoustic transducers, piezoelectric films may be of various shapes such as circle, square, rectangular, etc. As to such conventional electro-acoustic transducers with piezoelectric films of various shapes, the differences in the shapes of the films have brought about a little differences among the transducers in electro-mechanical and mechano-electrical converting efficiencies, to wit, sensitivity and sound pressure levels, and there has not been found out what shape, structure or direction of the piezoelectric film is the best for presenting remarkably high converting efficiency.

Now, there will be given a short account of the process which renders piezoelectricity to high molecular weight polymers and general characteristics of the piezoelectric films obtained, taking polyvinylidene fluoride resin (hereinafter referred to as $PVF_2$) as an example of the high molecular weight polymers.

A non-stretched $PVF_2$ film is uniaxially stretched up to four times the original length at 60° to 100°C. in a constant temperature bath thereby to orient its molecules in one direction. On both sides of the stretched film there is applied metal such as aluminum as electrodes by a vacuum evaporation method. Then, the film is heated up to a polarization temperature of 80° to 130°C. while having applied thereto a DC electric field of 700 to 1500 KV/cm. The thus polarized film is left as it is for about 10 to 20 minutes and cooled to room temperature with the electric field still applied. The above operation is called "polarizing treatment". When an electric field lower than the above coercive field is applied on the polarized film, said film, like piezoelectric ceramics, produces distortion and stress in proportion to the electric field. This means that the polarized film has activity similar to usual piezoelectric materials. However, unlike piezoelectric ceramics, the film has a remarkable anisotropy in itself. The anisotropy, if explained using co-ordinates wherein the stretch direction of the film is on the first axis and the direction perpendicular to the plane of the film is on the third axis, is about $d_{31} \approx 10d_{32}$ in terms of piezoelectric constants. Generally stated, in a uniaxially stretched high molecular weight piezoelectric film, the extent of the extension or contraction of the film is at a maximum in the direction of a vector field or a resultant vector of piezoelectric constants in the plane of the film, and said direction may be same as or different from the stretch direction of the film depending upon the kind of high polymer employed. The present invention will be illustrated hereinafter taking as an example a piezoelectric film employing $PVF_2$, which has the largest piezoelectric constant of $d_{31}$ in its stretch direction, or the direction of orientation of the molecules. Thus, the wording "stretch direction", as used hereinafter in connection with such $PVF_2$ film, means the direction in which the extent of the extension or the contraction of the piezoelectric film is at a maximum, namely, the piezoelectric constant is at a maximum.

In the field of an electro-acoustic transducer, it is necessary to design a transducer with due regard to anisotropy of a piezoelectric film to be employed therein.

The present inventors made this invention, noticing the effect of the shape of a support means which supports a diaphragm in relation to the stretch direction of the film. In other words, the present invention was made based on such a novel finding that there is a special relationship between a shape and orientation of a stretched film to be employed as a diaphragm and the converting efficiency of a piezoelectric electro-acoustic transducer, and that with a specific arrangement of a piezoelectric diaphragm in relation to the shape and orientation of a stretched film there can be attained an unexpectedly excellent converting efficiency of the piezoelectric electro-acoustic transducer.

Accordingly, an object of the present invention is to provide a piezoelectric electro-acoustic transducer which has a high converting efficiency.

Another object of the present invention is to provide a piezoelectric electro-acoustic transducer which has an excellent response characteristics, especially at the low frequency range.

Essentially, according to the present invention there is provided a piezoelectric electro-acoustic transducer comprising a piezoelectric diaphragm made of a high polymeric resin and having its molecules uniaxially oriented, said piezoelectric diaphragm having a great anisotropy in the plane thereof and being of a shape having a major axis and a minor axis; and a support means for fixing said piezoelectric diaphragm, characterized in that a direction of a resultant vector of piezoelectric constants in the plane of the diaphragm is substantially in parallel with the minor axis thereof.

The invention will be better understood from the following description taken in connection with the accompanying drawings in which.

Figure 1:
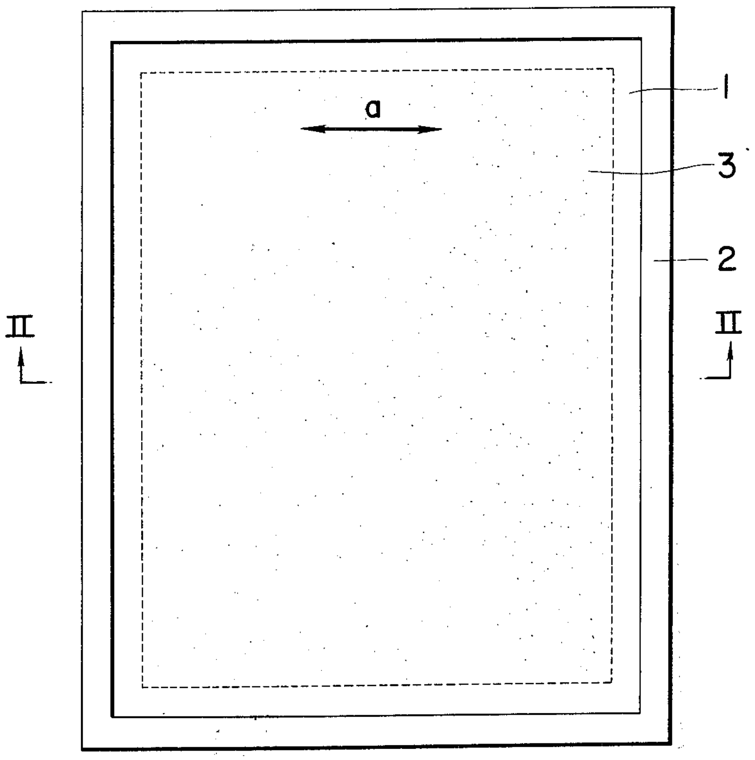
FIG. 1 is a plan view of an essential part of a headphone with a piezoelectric speaker according to the present invention.
Figure 2:
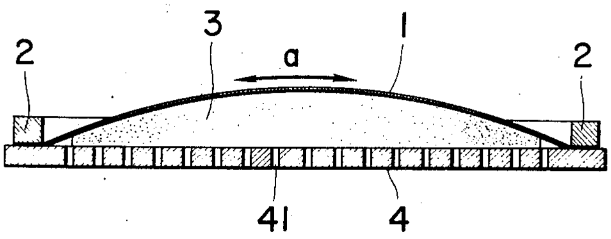
FIG. 2 is a sectional view of FIG. 1 taken along the line II—II.

Referring now to FIGS. 1 and 2, there is illustrated one form of a headphone with a piezoelectric speaker embodying the present invention.

Numeral 1 designates a diaphragm having piezoelectricity prepared by the process explained hereinbefore. The diaphragm is shaped so as to have the major axis and the minor axis with the stretch direction (shown by an arrow *a*) being substantially in parallel with the minor axis thereof. Strictly stated, it is the best to make the diaphragm so that the direction of the resultant vector of piezoelectric constants in the plane of the diaphragm is in parallel with the minor axis thereof. However, practically acceptable effects of the present invention can be obtained when the direction in which the piezoelectric film diaphragm has the largest piezoelectric constant is substantially in parallel with the minor axis thereof, especially in case of $PVF_2$. Numeral 2 designates a support means made of stiff substance for fixing the diaphragm 1. Said support means 2 is also shaped so as to have the major axis and the minor axis corresponding to the shape of the diaphragm 1.

A backing means 3 of resilient material such as polyurethane foam is provided on the back of the diaphragm 1 to impart proper tension and/or resiliency to the diaphragm. The backing means 3 is fixed by a base plate 4 which is made of rigid material and has holes 41 of desired size and number in order that the air is not sealed.

Repeatedly speaking, in the present invention, the diaphragm 1 of the electro-acoustic transducer is made of a piezoelectric thin film of a high polymeric resin which has been uniaxially stretched and of a shape having a major axis and a minor axis, for example, rectangular or oval. Said piezoelectric diaphragm is supported by the support means 2 in such a manner that the stretch direction *a* of the film is substantially in parallel with the minor axis thereof. The support means 2 may alternatively consist of at least a pair of fixing members arranged opposite to each other.

With such construction as explained above, the present invention can provide a piezoelectric electro-acoustic transducer which has high sound pressure levels especially at the low frequency range as is substantiated in FIGS. 3 and 4 which show the result of comparative tests of about characteristics of three types of headphones as follows:

A. a headphone with a speaker employing a piezoelectric diaphragm of the present invention;

B. a headphone similar to the headphone of A except that the piezoelectric diaphragm is made circle; and C. a headphone similar to the headphone of A except that the stretch direction of the film is directed in parallel with the major axis of the diaphragm.

Figure 3:
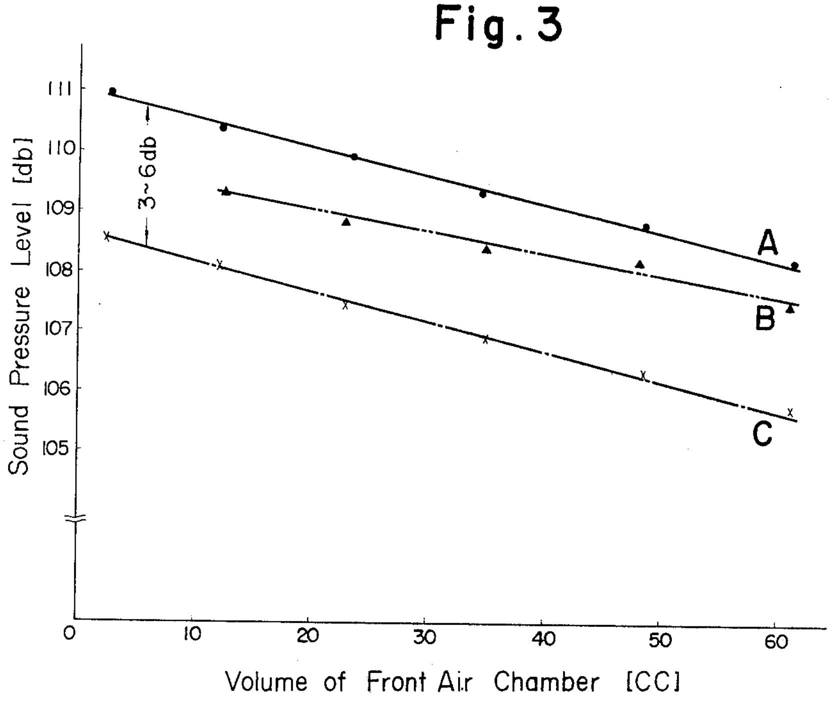
FIG. 3 and FIG. 4 are graphs showing characteristics of three types of piezoelectric speaker headphones employing, as diaphragms, films of the same property and the same area respectively, but different in arrangement in respect of shape and axis thereof.

FIG. 3 shows sound pressure levels of the headphones A, B and C, respectively measured at a fixed input signal voltage, varying the volume of the front air chamber (the volume of air-tight space between the diaphragm and a microphone for measurement). The frequency range as measured was 200 to 500 Hz.

Figure 4:
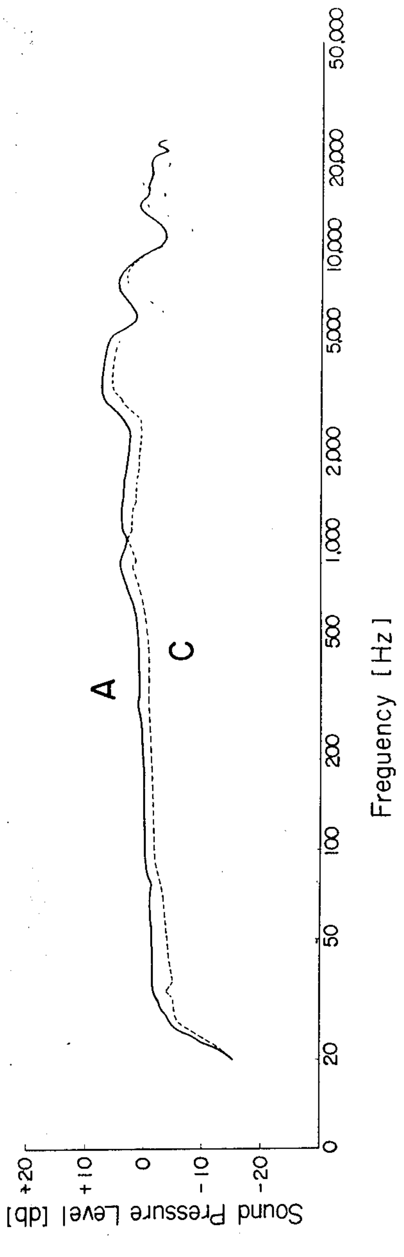

FIG. 4 is a graph showing frequency characteristics of the headphones A and C.

From FIGS. 3 and 4, it is clear that the headphone of the present invention employing the piezoelectric speaker is superior, up to 3 to 6 db in sound pressure levels at low frequencies, to other type headphones employing a piezoelectric diaphragm of the same area and the same property as employed in the present invention but having different arrangements in respect of shape and axis thereof.

Though the present invention has been described taking a headphone with a diaphragm of $PVF_2$ as an example, it should be noted that the invention is applicable in reverse to various piezoelectric electro-acoustic transducers such as microphones, etc. Further, high molecular weight piezoelectric materials are not limited to $PVF_2$ film, but there may be employed thin films of other high molecular weight polymers having flexibility, for example, polyvinyl fluoride (PVF), polyvinyl chloride (PVC), nylon-11, polypeptide (PMG), etc.

As mentioned above, according to the present invention, the piezoelectric electro-acoustic transducer is improved in reproduction conversion efficiency, especially at low frequencies. Hence, even in case a film material having limited physical properties including a piezoelectric constant, or a relatively small-size diaphragm is employed in a piezoelectric electro-acoustic transducer, there can be obtained an improved converting efficiency especially at low frequencies as compared with the conventional ones constructed without regard to arrangement of shape and axis of the diaphragm in respect of the direction in which the diaphragm has the largest piezoelectric constant.

While there has been described a preferred form of the invention, obviously modifications and variations are possible in light of the above teachings. It is therefore to be understood that within the scope of the appended claims, the invention may be practiced otherwise than as specifically described.

What is claimed is:

1. A piezoelectric electro-acoustic transducer comprising:

a piezoelectric diaphragm made of a high polymeric resin having its molecules uniaxially oriented, said diaphragm having a great anisotropy in the plane thereof and being of an elongate shape having a length dimension greater than its width dimension;

a support means conforming in plan to said diaphragm such that its length correspondingly exceeds its width, such support means including a rigid perforate base plate behind said diaphragm, a resilient foam backing member sandwiched between the major central areas of said diaphragm and base plate in fixed relation to said base plate, and at least one opposed pair of elongate, stiff fixing members along opposed edges of said diaphragm for fixing said diaphragm edges with respect to said base plate;

the resultant vector of the piezoelectric constants in the plane of said diaphragm being parallel to the diaphragm and support means width dimension and substantially perpendicular to the diaphragm and support means length dimension, for improved electro-acoustic conversion efficiency particularly in the low frequency range of the transducer.

2. A piezoelectric electro-acoustic transducer as claimed in claim 1, in which said diaphragm resin is polyvinylidene fluoride resin uniaxially stretched in the direction of molecular orientation, the direction of stretch being along the narrower, width dimension of said diaphragm and support means.

3. A piezoelectric electro-acoustic transducer as claimed in claim 2, in which said diaphragm and base plate are rectangular in shape.

4. A piezoelectric electro-acoustic transducer as claimed in claim 2, in which said diaphragm and base plate are oval in shape.

5. A piezoelectric electro-acoustic transducer as claimed in claim 2, in which said fixing members comprise a rectangular frame overlying the perimeter of each of the diaphragm and base plate, said resilient backing member having a perimeter spaced inboard of said frame, said resultant vector of piezoelectroc constants in the plane of said diaphragm extending substantially perpendicular to the length dimension of said fixing member frame.

6. In a piezoelectric electro-acoustic transducer comprising a piezoelectric diaphragm made of a high polymeric resin and having its molecules uniaxially oriented, said piezoelectric diaphragm having a great anisotropy in the plane thereof and being of a shape having a major axis and a minor axis; and a support means for fixing said piezoelectric diaphragm; the improvement wherein the direction of the resultant vector of the piezoelectric constants in the plane of the diaphragm is in parallel with said minor axis of said diaphragm.

7. A piezoelectric electro-acoustic transducer as claimed in claim 6, wherein said support means consists of at least a pair of fixing members made of stiff substance and located opposite to each other.

8. In a piezoelectric electro-acoustic transducer comprising a piezoelectric diaphragm made of a high polymeric resin and having its molecules uniaxially oriented, said piezoelectric diaphragm having a great anisotropy in the plane thereof and being of a shape having a major axis and a minor axis; and a support means for fixing said piezoelectric diaphragm; the improvement wherein the direction in which said piezoelectric diaphragm has the largest piezoelectric constant in its plane is in parallel with said minor axis thereof.

* * * * *